United States Patent
Mochizuki et al.

(10) Patent No.: US 8,488,391 B2
(45) Date of Patent: Jul. 16, 2013

(54) MEMORY CHIP WITH BUFFER CONTROLLED BASED UPON THE LAST ADDRESS CYCLE

(75) Inventors: Hikaru Mochizuki, Kanagawa-ken (JP); Yasuaki Niino, Kanagawa-ken (JP); Koichi Magome, Shanghai (CN)

(73) Assignee: Kabushiki Kaisha Toshiba, Tokyo (JP)

( * ) Notice: Subject to any disclaimer, the term of this patent is extended or adjusted under 35 U.S.C. 154(b) by 255 days.

(21) Appl. No.: 13/080,261

(22) Filed: Apr. 5, 2011

(65) Prior Publication Data

US 2011/0249512 A1    Oct. 13, 2011

(30) Foreign Application Priority Data

Apr. 9, 2010   (JP) ................... 2010-090478

(51) Int. Cl.
*G11C 7/10* (2006.01)
(52) U.S. Cl.
USPC ................. 365/189.05; 365/230.08
(58) Field of Classification Search
None
See application file for complete search history.

(56) References Cited

U.S. PATENT DOCUMENTS 7,203,091 B2 * 4/2007 Inoue et al. ............. 365/185.09
7,423,904 B2 * 9/2008 Kojima ................... 365/185.09

FOREIGN PATENT DOCUMENTS

JP    11-120075           4/1999
JP    2005302290 A   * 10/2005

OTHER PUBLICATIONS

English Abstract of JP2005-302290, retreived from eSp@cenet Mar. 15, 2013. 1 page.*
English machine translation of JP2005-302290, retrieved from PAJ Jan. 24, 2013. pp. 1-19.*

* cited by examiner

*Primary Examiner* — Alexander Sofocleous
(74) *Attorney, Agent, or Firm* — Oblon, Spivak, McClelland, Maier & Neustadt, L.L.P.

(57) ABSTRACT

A memory chip includes: a memory region; a chip determining unit configured to perform a chip determination, in writing operation, to determine whether or not the memory region is a writing target on the basis of an inputted address of writing destination, and to output a determination result of the chip determination; an address-cycle identifying unit configured to detect a final cycle of the address of writing destination, and to output a detection result at a timing before the output of the determination result; and a buffer controller configured to switch an input buffer from one state to another on the basis of the determination result, wherein the buffer controller keeps the input buffer in an active state irrespective of the determination result of the chip determination while the address-cycle identifying unit is outputting the detection result.

16 Claims, 11 Drawing Sheets

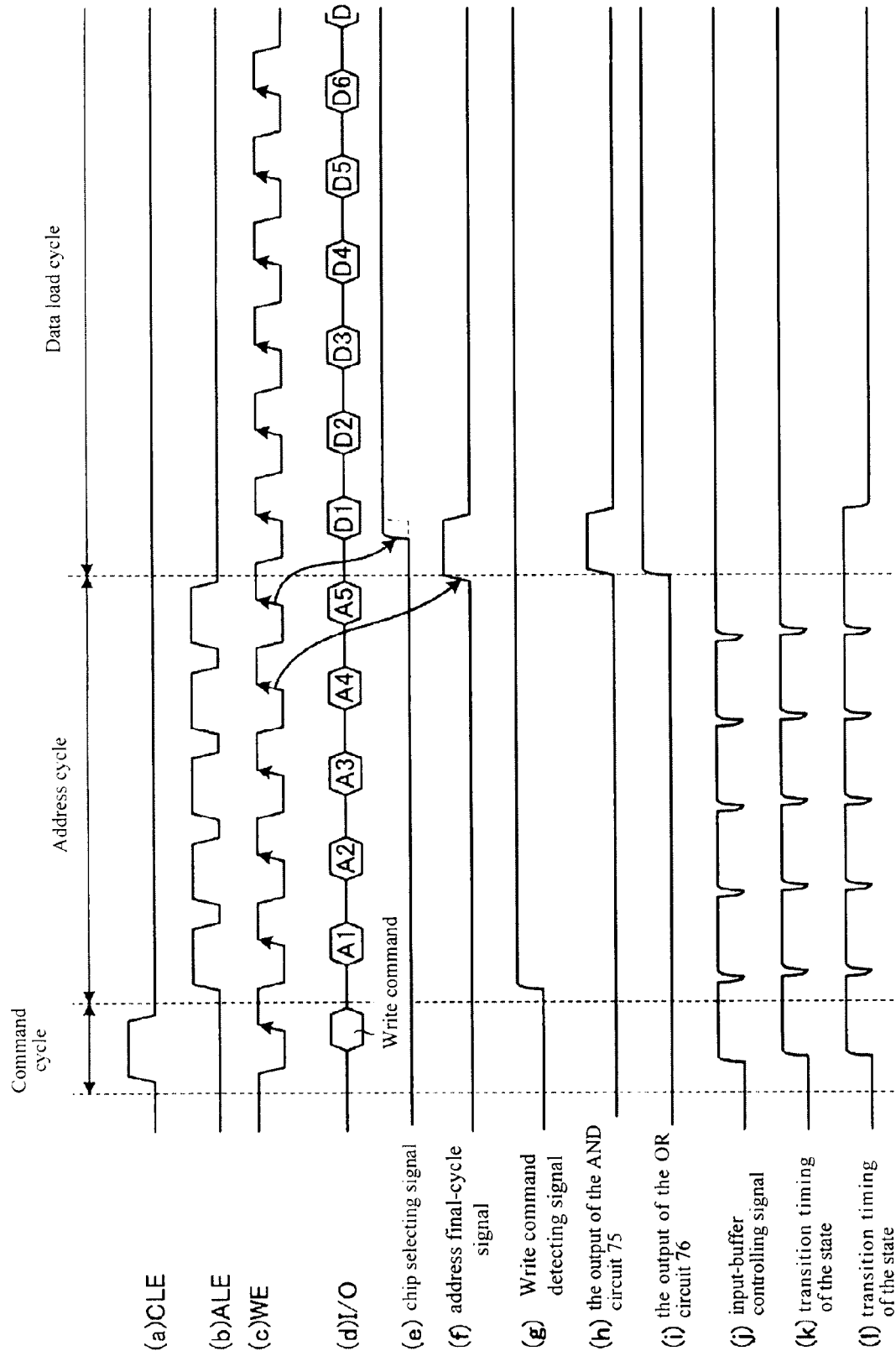

MEMORY CHIP WITH BUFFER CONTROLLED BASED UPON THE LAST ADDRESS CYCLE

CROSS-REFERENCE TO RELATED APPLICATIONS

This application is based upon and claims the benefit of priority from the prior Japanese Patent Application No. 2010-090478, filed Apr. 9, 2010, the entire contents of which are incorporated herein by reference.

FIELD

Embodiments described herein relate generally to a memory chip and a multi-chip package.

DESCRIPTION OF THE RELATED ART

Solid state drives (SSDs) each equipped with a memory chip including NAND-type memory cells (NAND chip) have been attracting attention as memory systems used in computers. The SSDs have various advantages, such as their faster speed and lighter weight, over magnetic disk drives.

For designing of an SSD, a multi-chip package (stacked memory) including multiple NAND chips stacked on one another has to be used to increase the data capacity of the SSD within the limitations on the mounting area and the number of pins of the controller chip that executes the access control of the NAND chips. In the multi-chip package, an I/O signal line and a control signal line are connected in common to multiple NAND chips. Commands, addresses, and data inputted by the controller chip are transmitted to all the NAND chips to which the signal lines are connected in common.

Japanese Patent Application Publication No. Hei 11-120075 (Patent Document 1) discloses a technique of allowing all NAND chips in a multi-chip package to operate without having collision of output signals on a signal line connected in common to the NAND chips. According to Patent Document 1, each of the NAND chips in the multi-chip package has an option pin to set a state unique to the NAND chip. Which of the NAND chips is the access target is determined by comparing higher-order bits of the address commonly received by the multiple NAND chips and the states set in the option pins. On the basis of the determination result, the output buffer is either activated or inactivated. In addition, Japanese Patent Application Publication No. 2005-302290 (Patent Document 2) discloses a technique in which an input buffer to receive input of data is controlled by using an input enable signal (input buffer control signal).

BRIEF DESCRIPTION OF THE SEVERAL VIEWS OF THE DRAWINGS

FIG. 11 is a timing chart describing the transition timing of an input buffer to which the embodiment is applied.

DETAILED DESCRIPTION

If the input buffer of a NAND chip that is not an access target receives write data at the time of data writing to a multi-chip package, the driving current for the input buffer is consumed wastefully. Accordingly, it may be preferable that those NAND chips not targeted for the data writing keep their respective input buffers in an inactivate state while the write data are being transmitted (data load cycle).

In this case, whether each chip is the writing target or not may be determined first on the basis of the address of the writing destination, and then each input buffer, may be activated or inactivated by use of an input-buffer controlling signal after the determination. The inventors of this application, however, have found out that this way may cause a problem of having a failure of writing a part of the write data transmitted immediately after the address of the writing destination because the input buffer is activated with a large delay after the receipt of the address of the writing destination.

A memory chip and a multi-chip package of an embodiment will be described in detail below with reference to the accompanying drawings. The following embodiment, however, does not limit the invention. In the following description, a NAND chip including NAND-type memory cells is taken up as an exemplary memory chip, but the embodiment is applicable to memory chips other than the NAND chips. In addition, the multiple memory chips in the multi-chip package are not necessarily stacked one upon another.

Embodiment

Figure 1:
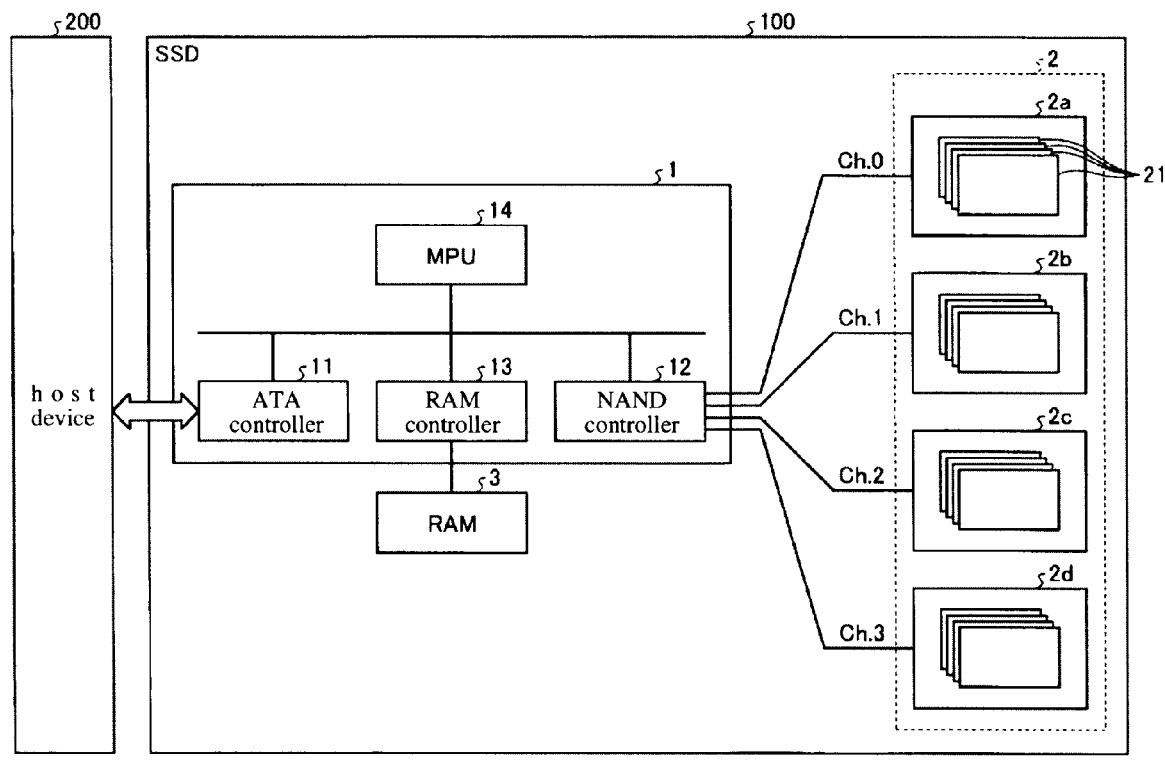
FIG. 1 is a diagram illustrating an exemplary configuration of an SSD.

FIG. 1 is a diagram illustrating an exemplary configuration of an SSD equipped with NAND chips according to an embodiment. As FIG. 1 shows, an SSD 100 is connected to a host device 200 such as a personal computer with a network interface of the ATA (advanced technology attachment) standard, and functions as an external storage device for the host device 200. The SSD 100 includes a NAND memory 2, a data transferring device 1, and a RAM 3. The NAND memory 2 stores the data read or written by the host device 200. The data transferring device 1 is a controller chip to not only transfer data between the host device 200 and the NAND memory 2 but also to control the access to the NAND memory 2 as a part of the data transfer. The RAM 3 is a volatile memory where the data transferring device 1 temporarily stores the transfer data for the transferring of data. Under the control of the data transferring device 1, the data sent from the host device 200 are temporarily stored in the RAM 3, and then are read from the RAM 3 to be written to the NAND memory 2.

The data transferring device 1 includes an ATA-interface controller (ATA controller) 11, a RAM controller 13, a NAND controller 12, and an MPU 14. The ATA controller 11 executes both the controlling of the ATA I/F and the controlling of the data transfer between the host device 200 and the RAM 3. The RAM controller 13 controls the data-reading from and the data writing to the RAM 3. The NAND controller 12 executes the controlling of the data transfer between the NAND memory 2 and the RAM 3. The MPU 14 executes the controlling of the entire data transferring device 1 in accordance with the instructions of the firmware.

The NAND memory 2 includes multiple (specifically four in this embodiment) memory packages 2a to 2d as multi-chip packages. The accesses to these multiple memory packages 2a to 2d are controlled in a parallel manner. The memory packages 2a to 2d are connected to the NAND controller 12 independently of one another via signal lines (channels ch0 to ch3), respectively. The NAND controller 12 executes the reading from or the writing to the memory packages 2a to 2d in accordance with the read or write commands from the MPU14 by sending each of the memory packages 2a to 2d both I/O signals and control signals that include commands, addresses, and data.

Figure 2:
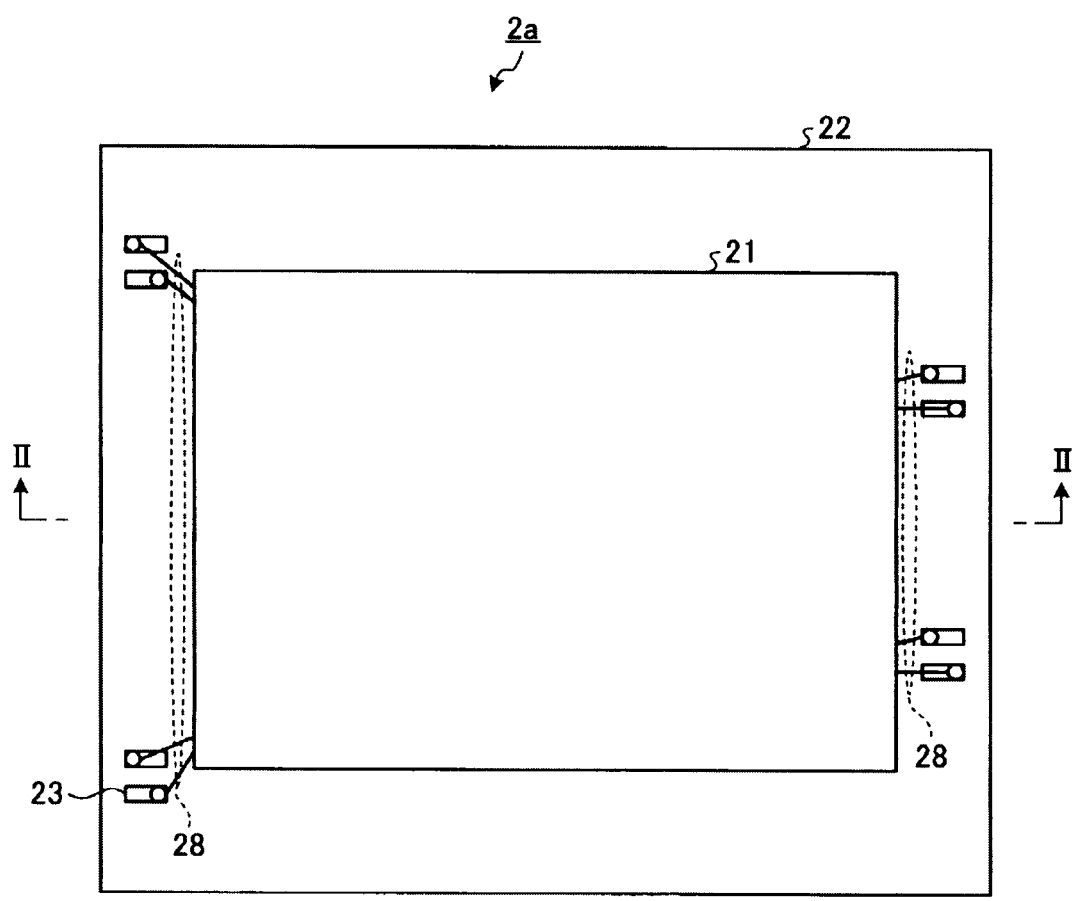
FIG. 2 is a diagram illustrating a layout of a memory package.
Figure 3:
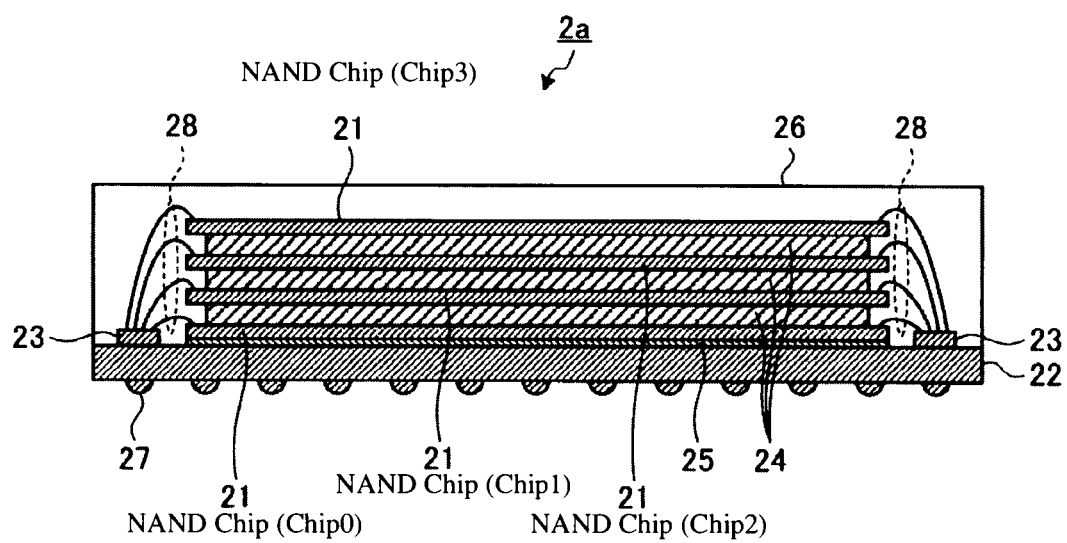
FIG. 3 is a cross sectional diagram of the memory package taken along the line II-II of FIG. 2.

Each of the memory packages 2a to 2d includes multiple (specifically four in this embodiment) NAND chips 21. FIG. 2 illustrates the layout of each of the memory packages 2a to 2d. Since the configurations of the memory packages 2a to 2d are identical to one another, the following description focuses solely on the memory package 2a. FIG. 3 illustrates a cross section of the memory package 2a taken along the line II-II of FIG. 2.

A NAND chip (chip0) 21, a spacer 24, a NAND chip (chip1) 21, a spacer 24, a NAND chip (chip2) 21, a spacer 24, and a NAND chip (chip3) 21 are stacked in this order on a substrate 22. The lowermost NAND chip (chip0) 21 is fixed to the substrate 22 with an underfill 25 made of a resin.

Multiple terminals 23 are provided on the substrate 22. The terminals (pins) of the NAND chips 21 are electrically connected to the corresponding terminals 23 on the substrate 22 with bonding wires 28. Solder balls 27 are provided under the substrate 22 and are electrically connected to the terminals 23. The memory package 2a is soldered onto a print circuit board on which the data transferring device 1 and the RAM 3, for example, are mounted. Both the electric power to drive the NAND chips 21 and the various kinds of signals from the NAND controller 12 are inputted into the corresponding pins of the NAND chips 21 via the solder balls 27, the terminals 23, and the bonding wires 28. The multiple stacked NAND chips 21 and the bonding wires 28 on the substrate 22 are sealed by a molding resin 26. Note that the above-described memory package 2a has a BGA (ball grid array) package structure, but may have a different package structure such as a PGA (pin grid array) package structure.

Figure 4:
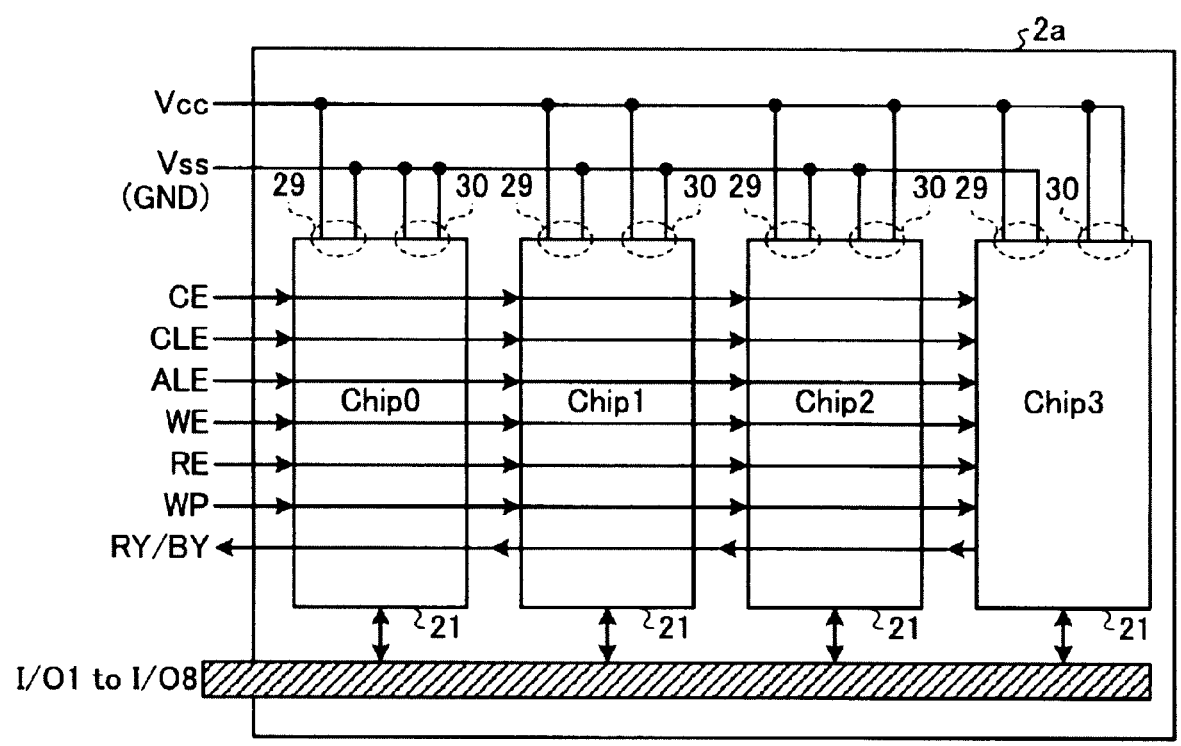
FIG. 4 is a circuit diagram illustrating four NAND chips.

FIG. 4 is a circuit diagram illustrating the four NAND chips 21 included in the memory package 2a. As FIG. 4 shows, a control signal line to control the NAND chips 21; an I/O signal line where commands, addresses, and data travel; and potential supply lines are connected to the memory package 2a. Signals that travel through the control signal line include chip enable signals (CE), command latch enable signals (CLE), address latch enable signals (ALE), write enable signals (WE), read enable signals (RE), write protect signals (WP), and ready/busy signals (RY/BY). The potential supply lines supply the power-supply potential Vcc and the ground potential Vss. As FIG. 4 shows, the control signal line and the I/O signal line are common wirings within the memory package 2a. The I/O signal line of this embodiment is an 8-bit signal line, for example. The band width of the I/O signal line, however, is not limited to 8 bits.

Each NAND chip 21 is provided with a potential supply pin 29 to which both the power-source potential Vcc to drive the same NAND chip 21 and the ground potential Vss (GND) are supplied. Both the power-source potential Vcc and the ground potential Vss are connected in common to the potential supply pin 29 of each NAND chip 21. In addition, each NAND chip 21 is provided with an option pin 30 that has two input pins. Either the ground potential Vss or the power-supply potential Vcc is connected to each of the two input pins of the option pin 30. The different ways of connection are used to discriminate each of the NAND chips 21 from the others.

For example, both of the two input pins of the option pin 30 of the Chip0 are connected to the ground potential Vss. Of the two input pins of the option pin 30 of the Chip1, the one on the left-hand side of the drawing is connected to the power-source potential Vcc whereas the one on the right-hand side of the drawing is connected to the ground potential Vss. Each NAND chip 21 determines whether or not the NAND chip 21 itself is the access target by comparing the highest 2 bits of the address transmitted through the I/O signal line with the state of the two input pins of the option pin 30. For example, suppose that, of the two input pins of the option pin 30, the one on the right-hand side of the drawing corresponds to the highest bit of the address whereas the one on the left-hand side of the drawing corresponds to the second highest bit. Suppose also that the state where the potential Vcc is supplied to each input pin corresponds to a value "1" and the state where the potential Vss is supplied to each input pin corresponds to a value "0." In this case, if the highest 2 bits of the address are "00," the Chip0 is the access target. If the highest 2 bits of the address are "01," the Chip1 is the access target.

Note that if the memory package 2a includes $2^n$ NAND chips 21, at least n input pins are needed for discriminating each NAND chip 21 from the others. As long as each NAND chip 21 can be discriminated from the others, the setting of the option pin 30 is not limited to the example shown in FIG. 4.

Figure 5:
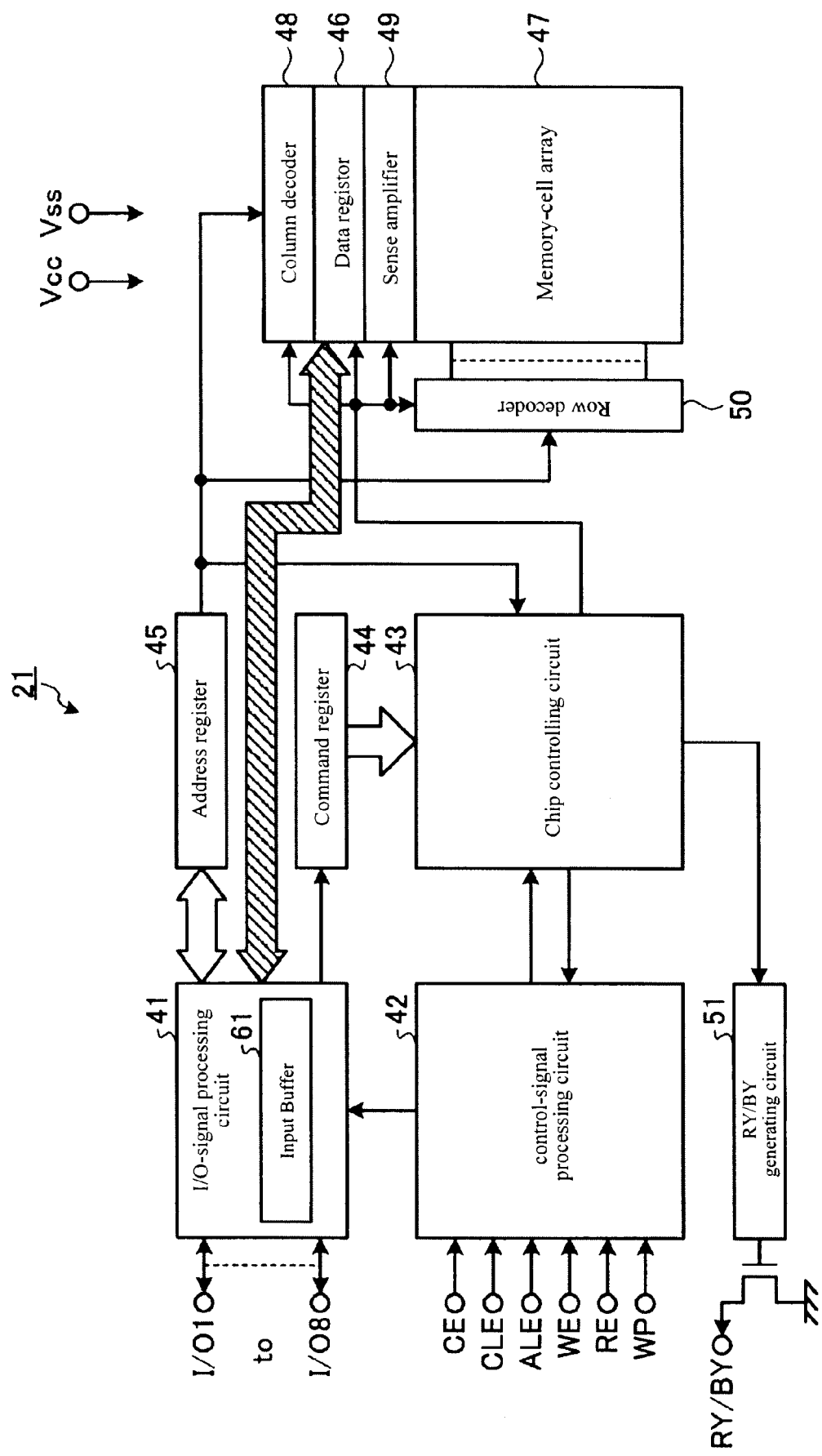
FIG. 5 is a block diagram describing the configuration of the NAND chip.

FIG. 5 is a block diagram describing the configuration of each NAND chip 21. As FIG. 5 shows, each NAND chip 21 includes an I/O-signal processing circuit 41, a control-signal processing circuit 42, a chip controlling circuit 43, a command register 44, an address register 45, a data register 46, a memory-cell array (memory region) 47, a column decoder 48, a sense amplifier 49, a row decoder 50, and an RY/BY generating circuit 51.

The chip controlling circuit 43 is a state-transition circuit (state machine) that transitions among states in accordance with the control signals of various kinds received through the control-signal processing circuit 42. The chip controlling circuit 43 controls the actions of the entire NAND chip 21. The RY/BY generating circuit 51 makes the state of the RY/BY signal line between the ready state (RY) and the busy state (BY) under the control by the chip controlling circuit 43.

The I/O-signal processing circuit 41 is a buffer circuit to exchange I/O signals with the data transferring device 1 via the I/O signal line. Specifically, the I/O-signal processing circuit 41 includes an output buffer and an input buffer 61. The output buffer is used to send I/O signals to the data transferring device 1. The input buffer 61 is used to take the I/O signals into the NAND chip 21. The input buffer 61 is either activated or inactivated by the input-buffer controlling signal that is inputted from the control-signal processing circuit 42.

Figure 6:
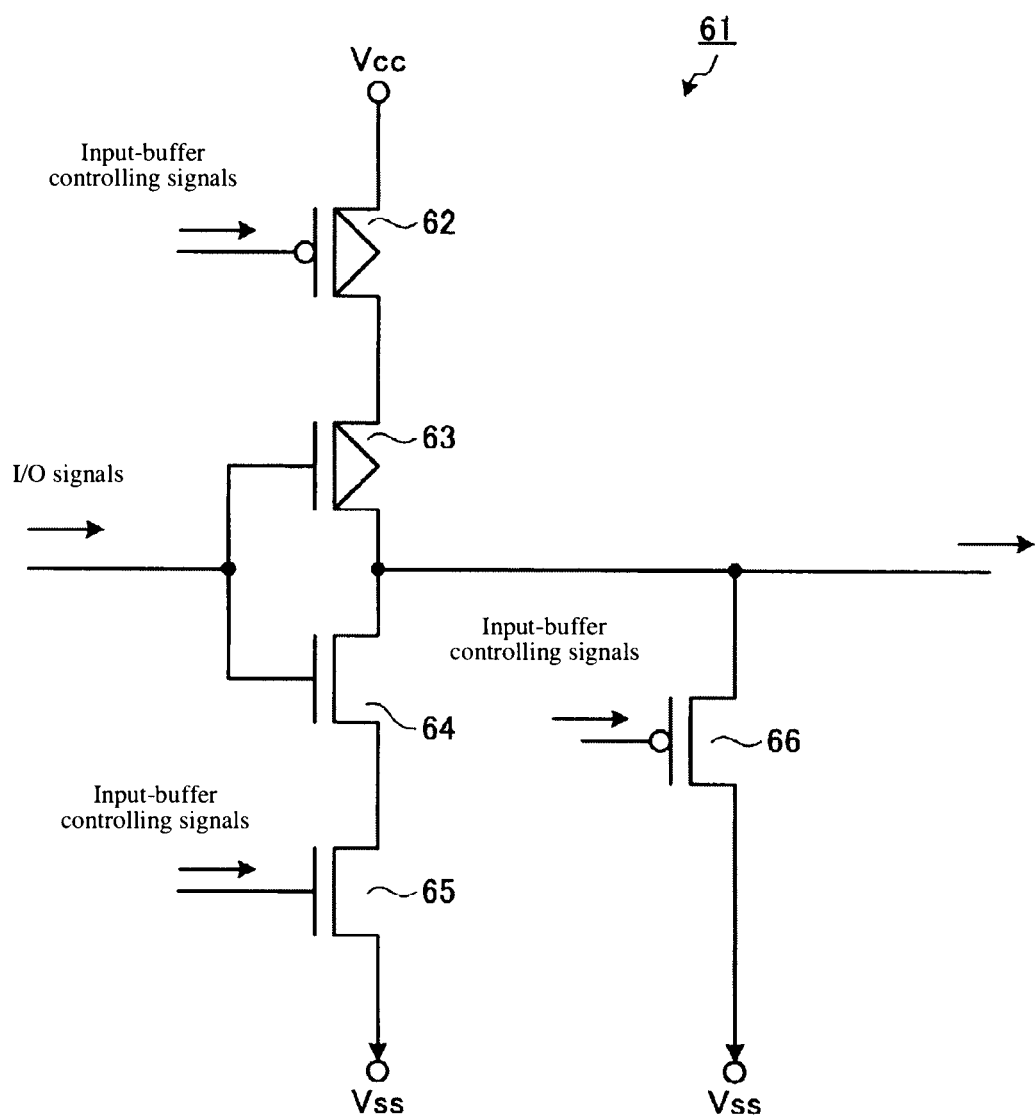
FIG. 6 is a circuit diagram describing the configuration of an input buffer.

FIG. 6 is a circuit diagram describing the configuration of the input buffer 61. As FIG. 6 shows, the input buffer 61 includes multiple MOSFETs (metal oxide semiconductor field effect transistors) combined together each of which has a stacked gate structure formed on a semiconductor substrate. Specifically, from the pin to which the power-source potential Vcc is supplied to the pin to which the ground potential Vss is supplied, a p-type transistor 62, a p-type transistor 63, an n-type transistor 64, and an n-type transistor 65 are provided in this order so that the current paths can be connected in series to one another. To put it differently, the multiple transistors 62 to 65 are connected in series to one another in the up-and-down direction of the drawing so that each two adjacent transistors share a diffusion region (either the source region or the drain region).

I/O signals are commonly inputted into the gate of the p-type transistor 63 and the gate of n-type transistor 64. The wiring connecting the drain of the p-type transistor 63 and the drain of the n-type transistor 64 to each other is taken in as the I/O signals received by the input buffer 61.

The gate of the n-type transistor 65 receives the input of the input-buffer control signals while the gate of the gate of the p-type transistor 62 receives the logically inverted input-buffer controlling signals. If the input buffer 61 receives an input of Low as an input-buffer controlling signal, the current path between the drain of the p-type transistor 62 and the drain of the n-type transistor 65 is cutoff and the input buffer 61 stops operating (i.e., becomes inactive). Conversely, if the input buffer 61 receives an input of High as an input-buffer controlling signal, the above-mentioned current path is restored and the input buffer 61 becomes in an operable state (i.e., becomes active). If the active input buffer 61 receives an I/O signal when being in the active state, the drain current flows through the above-mentioned current path and the electric power is consumed.

The wiring that is taken in as I/O signals is connected to the drain of the n-type transistor 66, the source of which is grounded and the gate of which receives the input of logically inverted input-buffer controlling signals. Thus, the fluctuation of the potential of the wiring can be avoided while the input buffer 61 is inactive.

The commands, addresses, and the data (write data) that the input buffer 61 with the above-described configuration takes in as I/O signals are sorted and stored in the address register 45, the command register 44, or the data register 46.

Note that the I/O signal line in this embodiment is an 8-bit signal line. Accordingly, the I/O signal line allows an address of 8 digits to be sent at a time. In recent years, however, the storage capacity of each single NAND chip 21 has become larger, so that each address sent from the data transferring device 1 has more than 8 digits in many cases. For example, if each of the four NAND chips 21 has a storage capacity of 1 gigabit, the memory package 2a has a memory space of 4 gigabits in total. Hence, each address has at least 32 digits to make the management of the memory space of the memory package 2a possible. Accordingly, when the address of every access target is sent through the 8-bit I/O signal line to the I/O-signal processing circuit 41, the address is divided into several pieces, which are sent, piece by piece, at several times. The address register 45 accumulates the several pieces that are sent individually, and combines these pieces together to restore the address.

As described earlier, the highest two bits of the restored address are used as the chip discriminating bits to discriminate one of the NAND chips 21 from the others. The restored address includes the chip discriminating bits, the row address, and the column address in this order from the highest-order. The chip discriminating bits are read by the chip controlling circuit 43, the row address is read by the row decoder 50, and the column address is read by the column decoder 48.

Figure 7:
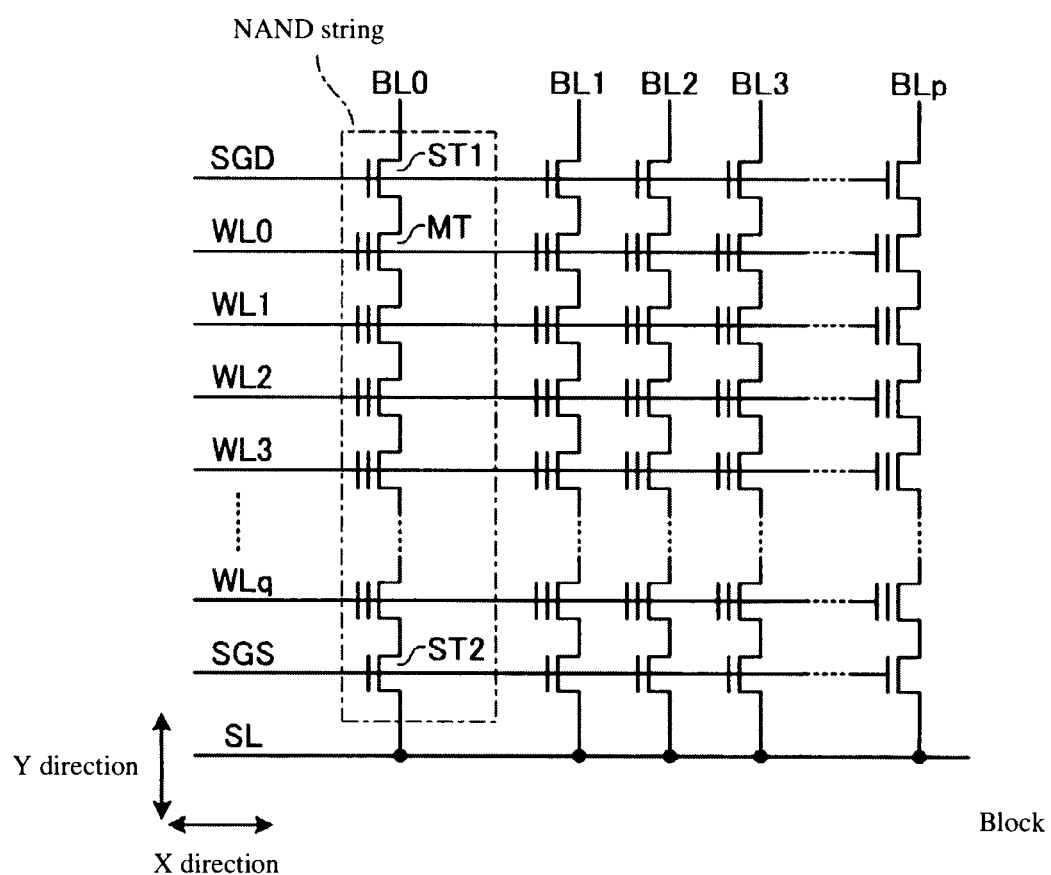
FIG. 7 is a circuit diagram illustrating an exemplary configuration of a single block included in a memory cell array.

The memory-cell array 47 includes multiple blocks each of which serves as the unit for the deletion. FIG. 7 is a circuit diagram illustrating an exemplary configuration of a single block included in the memory-cell array 47. As FIG. 7 shows, each block includes (m+1) NAND strings (m is an integer that is equal to zero or larger) that are arranged sequentially in the X direction. Each of the (m+1) NAND strings includes a selection transistor ST1 and a selection transistor ST2. The drain of each selection transistor ST1 is connected to one of bit lines BL0 to BLp. The gates of all the selection transistors ST1 are connected in common to a selection gate line SGD. The sources of all the selection transistors ST2 are connected in common to a source line SL. The gates of all the selection transistors ST2 are connected in common to a selection gate line SGS.

Each memory-cell transistor MT includes a MOSFET with a stacked gate structure. The stacked gate structure includes a charge accumulation layer (floating gate electrode) and a control gate electrode. The charge accumulation layer is formed on a gate insulation film formed on a semiconductor substrate. The control gate electrode is formed on an integrate insulation film formed on the charge accumulation layer. Each memory-cell transistor MT has a variable threshold voltage that varies depending on the number of electrons acuminated in the floating gate electrode. Each memory-cell transistor MT stores data in accordance with the difference in the threshold voltage. Each memory-cell transistor MT may be configured to store one-bit data. Alternatively, each memory-cell may be configured to store multiple-value data (2-bit or larger data).

The (n+1) memory-cell transistors MT included in each single NAND string are arranged between the source of the selection transistor ST1 and the drain of the selection transistor ST2 so that the current paths for the (n+1) memory-cell transistors MT are connected in series to one another. The control gate electrodes of the (n+1) memory-cell transistors MT, arranged from the drain side to the source side, are connected respectively to word lines WL0 to WLq. Hence, the drain of the memory-cell transistor MT with its control gate electrode connected to the word line WL0 is connected to the source of the selection transistor ST1. The source of the memory-cell transistor MT with its control gate electrode connected to the word line WLq is connected to the drain of the selection transistor ST2.

Each of the word lines WL0 to WLq is connected to the control gate electrodes of the memory-cell transistors MT that belong respectively to the different NAND strings included in the single block. To put it differently, the control gate electrodes of the memory-cell transistors MT that exist in the same row are connected in common to one of the word lines WL0 to WLq. The (m+1) memory-cell transistors MT that are connected to each single one of the word lines WL0 to WLq are treated as a single page. When data are written or read, each page is used as the unit for data writing and data reading.

The row decoder 50, the column decoder 48, and the sense amplifier 49 executes the accesses to the memory-cell array 47 under the control by the chip controlling circuit 43. Specifically, the row decoder 50 selects and activates one of the word lines WL0 to WLq that corresponds to the readout row address. The column decoder 48 selects and activates one of the bit lines BL0 to BLp that corresponds to the readout column address. The sense amplifier 49 applies a voltage to the bit line selected by the column decoder 48 and thus writes data stored in the data register 46 into the memory-cell transistor MT located at the intersection of the word line WL selected by the row decoder 50 and the bit line BL selected by the column decoder 48. The sense amplifier 49 reads out the data stored in the memory-cell transistor MT through the bit line BL, and stores the readout data in the data register 46. The data stored in the data register 46 are sent to the I/O-signal processing circuit 41 via a data line, and are then transferred from the I/O-signal processing circuit 41 to the data transferring device 1.

The control-signal processing circuit 42 receives the input of various kinds of control signals. In accordance with the control signals thus received, the control-signal processing circuit 42 determines the appropriate registers for storing the I/O signals received by the I/O-signal processing circuit 41. In addition, the control-signal processing circuit 42 transfers the received control signals to the chip controlling circuit 43. Furthermore, the control-signal processing circuit 42 generates input-buffer controlling signals.

Now, description will be given of a technique that is compared to the embodiment described thus far. According to the technique (which will be referred to as the technique of the comparative example), each NAND chip 21 firstly determines whether or not the same NAND chip 21 is the writing target in accordance with the higher-order bits of the address of the writing destination (chip discriminating bits). After the NAND chips 21 discovers that the same NAND chip 21 is the writing target, an input buffer 61 is activated.

Figure 8:
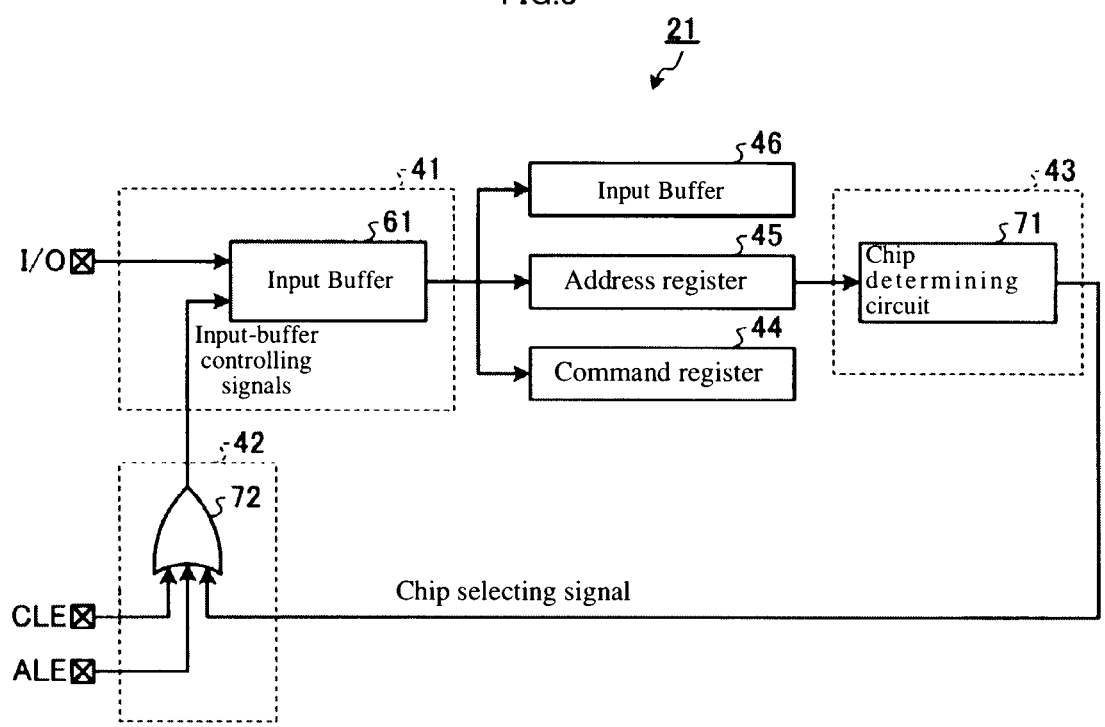
FIG. 8 is a diagram describing the functional configuration of a NAND chip to which a technique of a comparative example is applied.

FIG. 8 is a diagram describing the functional configuration of a NAND chip 21 to which the technique of the comparative example is applied. As FIG. 8 shows, each of the NAND chips 21 applied with the technique of the comparative example includes the input buffer 61, a chip determining circuit 71 and an OR circuit 72. The chip determining circuit 71 of the comparative example is mounted on a chip controlling circuit 43 whereas the OR circuit 72 is incorporated in a control-signal processing circuit 42.

The signals inputted into the input buffer 61 are sorted into a data register 46, an address register 45, and a command register 44. Then, the chip determining circuit 71 determines whether or not its own NAND chip 21 is the writing target by comparing the chip determining bits included in the address stored in the address register 45 with the state of the option pin (the determination will be referred to as chip determination). The result of the chip determination is outputted as a chip selecting signal. The chip determining circuit 71 of this comparative example outputs a High chip selecting signal if the access target is its own NAND chip 21. Conversely, the chip determining circuit 71 outputs a Low chip selecting signal if the access target is not its own NAND chip 21.

The OR circuit 72 executes an OR operation using the chip selecting signal, a CLE signal, and an ALE signal. Then, the OR circuit 72 outputs the operation result as an input-buffer controlling signal. The input-buffer control signal is inputted into the input buffer 61. Note that the state of the CLE signal becomes High when a command is sent to the NAND chip 21 whereas the state of the ALE signal becomes High when an address is sent thereto.

Figure 9:
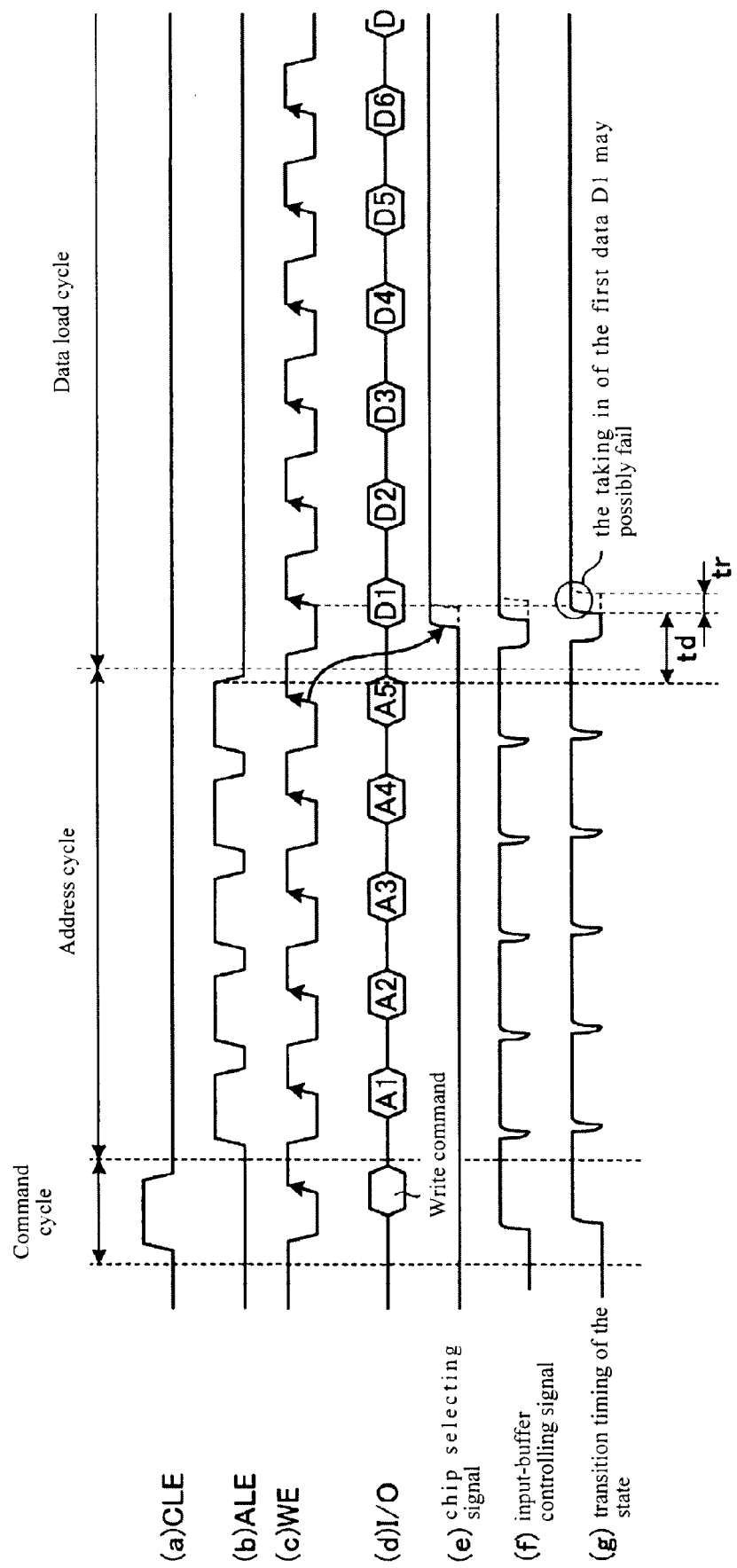
FIG. 9 is a timing chart describing the transition timing of an input buffer to which the technique of the comparative example is applied.

FIG. 9 is a timing chart describing the timing when the input buffer 61 applied with the technique of the comparative example transitions from the inactive state to the active state. In FIG. 9, the lines (a) to (f) respectively represent the transition timings of the states for the CLE signal, the ALE signal, the WE signal, the I/O signal, the chip selecting signal, and the input-buffer controlling signal. The line (g) represents the transition timing of the state (active/inactive) of the input buffer 61.

As FIG. 9 shows, the I/O signal is sent via the I/O signal line sequentially piece by piece at several times. The chip controlling circuit 43 recognizes, on the basis of the CLE signal, the period when the command is sent (command cycle). In addition, the chip controlling circuit 43 recognizes, on the basis of the ALE signal, the period when the address is sent (address cycle). In this comparative example, each address is divided into five pieces (A1 to A5) of I/O signal, and is sent piece by piece at five times. The ALE signal is not always in the High state during the address cycle. Rather, every time one of the pieces A1 to A5 of I/O signal is sent, the state of the ALE signal transitions between the High state and the Low state.

Once the address cycle ends, a data load cycle starts immediately, and data (D1, D2 . . . ) are sent sequentially. The I/O signal having been taken in by the input buffer 61 is taken in by each of the registers (the command register 44, the address register 45, and the data register 46) at the timing when the WE signal rises. The I/O signal thus taken in is stored in each register.

When detecting the rising of the WE signal corresponding to the fifth event of taking in the address, the chip determining circuit 71 reads out the chip discriminating bits to execute chip determination, and outputs a chip selecting signal. Since the OR circuit 72 receives the inputs of the CLE signal and the ALE signal, the state of the OR circuit 72 transitions in accordance with the transitions of the CLE signal during the command cycle and the ALE signal during the address cycle. After the start of the data load cycle, the OR circuit 72 makes the input-buffer control signal transition from High to Low in response to the rising of the WE signal corresponding to the fifth event of taking in the address. Then, in response to the transition from Low to High of the chip selecting signal, the OR circuit 72 makes the input-buffer controlling signal transition from Low back to High. The input buffer 61 is switched between the inactive state and the active state in accordance with the output of the input-buffer controlling signal from the OR circuit 72. Note that when the input-buffer control signal is in the High state, the input buffer 61 is in the active state.

A relatively large delay (td represents the delay time) occurs between the time when the chip determining circuit 71 detects the rising of the WE signal corresponding to the fifth event of taking in the address and the time when the state of the input buffer 61 transitions from the inactive state to the active state. The reading out of the chip discriminating bits from the address register 45 and the execution of the chip determination are some of the causes for the delay. If the fluctuation tr of the delay time td as well as the very existence of the delay time td are considered, the state of the input buffer 61 may, though occasionally, fail to transition to the active state in time for the timing of taking the first data D1 into the register. To put it differently, according to the technique of the comparative example, the taking in of the first data D1 may possibly fail.

In contrast, the embodiment is characterized mainly by preventing the taking in of the data D1 from failing. This is accomplished by making the input buffer 61 always active when the data D1 are received irrespective of whether or not its own NAND chip 21 is the access target.

Figure 10:
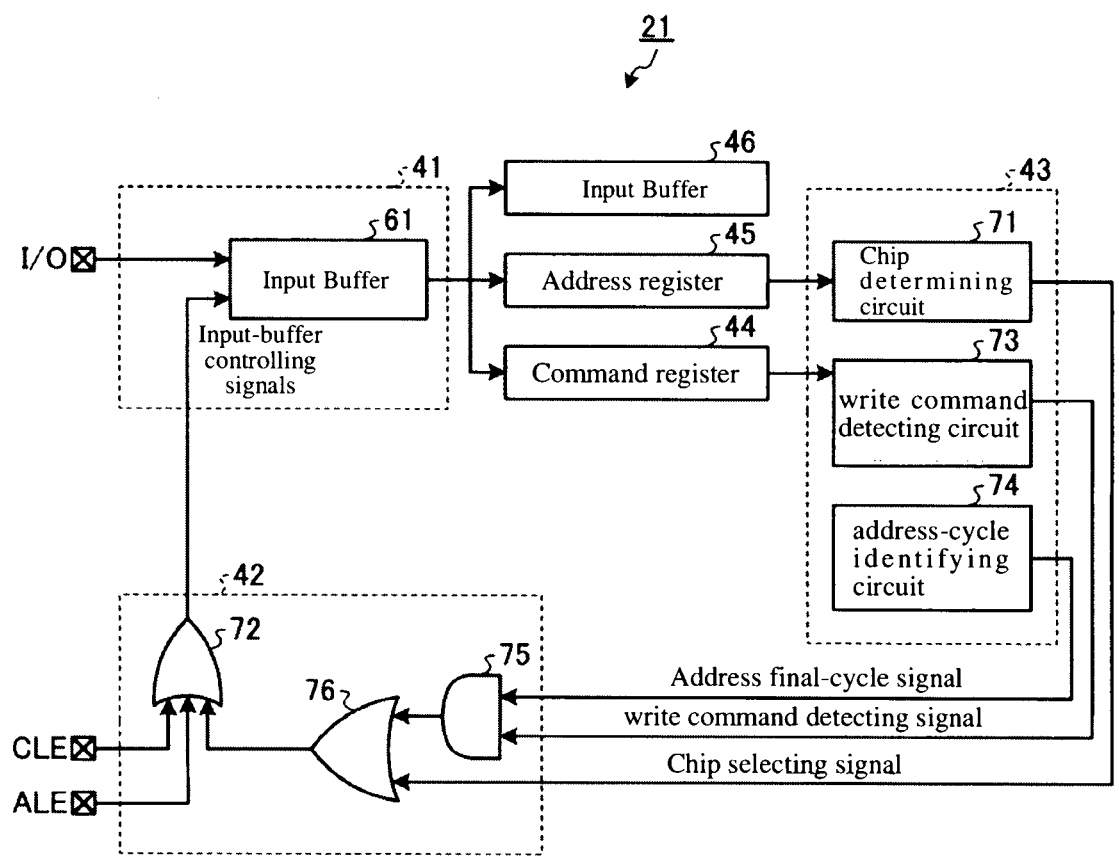
FIG. 10 is a diagram describing the functional configuration of a NAND chip to which an embodiment is applied.

FIG. 10 is a diagram describing the functional configuration of a NAND chip 21 to which the embodiment is applied. As FIG. 10 shows, each NAND chip 21 of the embodiment includes the input buffer 61, a chip determining circuit 71, an OR circuit 72, a write command detecting circuit 73, an address-cycle identifying circuit 74, an AND circuit 75, and an OR circuit 76.

The chip determining circuit 71, the write command detecting circuit 73, and the address-cycle identifying circuit 74 are mounted on the chip controlling circuit 43 whereas the OR circuit 72, the AND circuit 75, and the OR circuit 76 are incorporated in the control-signal processing circuit 42. The chip determining circuit 71 of the embodiment is identical to the functional constituent portions with the same name described earlier for the technique of the comparative example. Accordingly, no detailed description of the chip determining circuit 71 will be given herein.

The write command detecting circuit 73 reads out a command stored in the command register 44, and determines whether or not the read command is a write command. The write command detecting circuit 73 outputs the determination result as a write command detecting signal. If the read command is a write command, the write command detecting circuit 73 outputs a High write command detecting signal. Conversely, if the read command is not a write command, the write command detecting circuit 73 outputs a Low write command detecting signal.

The address-cycle identifying circuit 74 monitors the state machine of the chip controlling circuit 43, and detects the start of the state when the final piece (A5) of the address is inputted (the state will be referred to as the address final-input state). The address final-input state starts from the time corresponding to the rising of the WE signal in the cycle immediately before the final-address taking-in cycle. Then, in accordance with the timing of the detected start of the address final-input state, the address-cycle identifying circuit 74 generates an address final-cycle signal. To put it differently, the address-cycle identifying circuit 74 detects the final address cycle, and outputs the detecting result as the address final-cycle signal. To be more specific, when detecting the start of the address final-input state, the address-cycle identifying circuit 74 turns the state of the address final-cycle signal to the High state at an earlier timing than the timing for updating the chip selecting signal (i.e., the timing when the chip determining circuit 71 reflects the result of the chip determination in the chip selecting signal). After that, the address-cycle identifying circuit 74 turns the state of the address final-cycle signal to the Low state at a later timing than the timing for updating the chip selecting signal. Note that when to decide the timing when the state of the address final-cycle signal transitions to the Low state, the address-cycle identifying circuit 74 may rely on the detection of the timing when the address final-input state ends as long as the timing thus decided satisfies the above-described conditions.

The AND circuit 75, the OR circuit 76, and the OR circuit 72 work together to function as a buffer controller to switch the input buffer 61 between the active state and the inactive state. To switch the states of the input buffer 61, the buffer controller relies on the chip selecting signal. In addition, while the address final-cycle signal is in the High state, the buffer controller makes the input buffer 61 active irrespective of the state of the chip selecting signal.

Specifically, the AND circuit 75 performs an AND operation with the address final-cycle signal and the write command detecting signal. The OR circuit 76 performs an OR operation with the chip selecting signal and the result of the operation by the AND circuit 75. The OR circuit 72 receives the input of the result of the operation by the OR circuit 76 instead of the chip selecting signal. The OR circuit 72 performs an OR operation with the inputted operation result, the CLE signal, and the ALE signal. Then, the OR circuit 72 outputs the operation result as an input-buffer controlling signal.

FIG. 11 is a timing chart describing the timing when the input buffer 61 in each NAND chip 21 of the embodiment configured as described above transitions from the inactive state to the active state. In FIG. 11, the lines (a) to (j) respectively represent the transition timings for the CLE signal, the ALE signal, the WE signal, the I/O signal, the chip selecting signal, the address final-cycle signal, the write command detecting signal, the output of the AND circuit 75, the output of the OR circuit 76, and the input-buffer controlling signal. The line (k) represents the transition timing for the state of the input buffer 61.

As FIG. 11 shows, after the final rising of the ALE signal, the address-cycle identifying circuit 74 makes the state of the address final-cycle signal from the Low state to the High state at an earlier timing than the timing when the state of the chip selecting signal becomes High. Then, after the address-cycle identifying circuit 74 makes the state of the address final-cycle signal transition from the Low state to the High state, the address-cycle identifying circuit 74 makes the state of the address final-cycle signal transition from the High state to the Low state at a later timing than the timing when the state chip selecting signal becomes High.

Since the command sent to the write command detecting circuit 73 is a write command, the write command detecting circuit 73 makes the state of the write command detecting signal from the Low state to the High state. Note that while the state of the write command detecting signal is High, the state of the address final-cycle signal transitions from the Low state to the High state and then from the High state back to the Low state. Accordingly, the AND circuit 75 outputs substantially the same output as the address final-cycle signal.

The state of the output of the OR circuit 76, which is inputted into the OR circuit 72 in place of the chip selecting signal in the case of the comparative example, becomes High at an earlier timing than the chip selecting signal because the chip selecting signal is complemented by the output of the AND circuit 75. Hence, the input-buffer controlling signal outputted by the OR circuit 72 has an earlier timing for the transition to the High state at the start of the data load cycle than in the case where the technique of the comparative example is employed. As a consequence, the state of the input buffer 61 can transition to the active state in time for the timing when the data register 46 takes in the data D1. Note that, in the case shown in FIG. 11, the input-buffer controlling signal is kept in the High state from the time when the input-buffer controlling signal is in the High state due to the final piece of the ALE signal received during the address cycle to the time when the input-buffer controlling signal is in the High state due to the chip selecting signal that is based on the output of the OR circuit 76. The activation or the inactivation of the input buffer 61 is decided in accordance with the input-buffer controlling signal.

As has been described thus far, according to the embodiment, the address-cycle identifying circuit 74 detects the final cycle of the address of the writing destination, and thereby outputs the address final-cycle signal at an earlier timing than the timing for the output of the chip selecting signal. Thus, the buffer controller (specifically, the AND circuit 75, the OR circuit 76, and the OR circuit 72 working together) keeps the input buffer 61 active irrespective of the state of the chip selecting signal while the address final-cycle signal is in the High state. Accordingly, the electric power consumption of the input buffer can be reduced without causing a failure to take in the input data.

In addition, the address-cycle identifying circuit 74 makes the state of the address final-cycle signal transition to the Low state at a later timing than the timing for updating the chip selecting signal. Accordingly, the electric power consumption of the input buffer can be reduced without causing a failure to take in the input data.

In FIG. 11, the line (1) represents the transition timing of the state of the input buffer 61 when the NAND chip 21 corresponding to the input buffer 61 is not the access target. The address final-cycle signal is outputted irrespective of whether or not the NAND chip 21 corresponding to the input buffer 61 is the access target. Hence, as the FIG. 11 shows, the input buffer 61 is kept in the active state by the address final-cycle signal during an earlier part of the data load cycle even if the NAND chip 21 corresponding to the input buffer 61 is not the access target. Meanwhile, the write data have a larger size than the size of the address, so that the write data are sent via the I/O signal line piece by piece at several tens to several thousands of times. Hence, even if the input buffer 61 is kept active during merely the first part of the data load cycle, the input buffer 61 can be made inactive for so long a time as the longer remaining part of the data load cycle. Thus, the technique of the embodiment can have an approximately comparable electric-power saving effect to the case of the technique of the comparative example.

If the command received by the input buffer 61 is a write command, the buffer controller switches the states of the input buffer 61 in accordance with the address final-cycle signal. Conversely, if the command received by the input buffer 61 is not a write command, the buffer controller does not switch the states of the input buffer 61 in accordance with the address final-cycle signal. Hence, if the inputs of a series of I/O signals are accompanied by no data load cycle such as in a case of reading processing, the input buffer 61 can be prevented from being uselessly activated in accordance with the address final-cycle signal.

Note that the logics of either some or all the signals described above may be inversed from positive to negative or vice versa. In addition, each of the gate circuits (the OR circuit 72, the AND circuit 75, and the OR circuit 76) included in the buffer controller or the combination of these gate circuits may be modified appropriately. Although, in the description given above, these gate circuits are incorporated in the control-signal processing circuit 42, the positions where these gate circuits are provided do not have to be within the control-signal processing circuit 42. Likewise, the positions where chip determining circuit 71, the write command detecting circuit 73, and the address-cycle identifying circuit 74 are provided do not have to be within the chip controlling circuit 43.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory chip comprising:
a memory region;
a chip determining unit configured to perform a chip determination, in writing operation, to determine whether or not the memory region is a writing target on the basis of an inputted address of writing destination, and to output a determination result of the chip determination;
an address-cycle identifying unit configured to detect a final cycle of the address of writing destination, and to output a detection result at a timing before the output of the determination result; and
a buffer controller configured to switch an input buffer from one state to another on the basis of the determination result, wherein
the buffer controller keeps the input buffer in an active state irrespective of the determination result of the chip determination while the address-cycle identifying unit is outputting the detection result.

2. The memory chip according to claim 1, wherein an I/O signal line to access the memory region is connected in common to a plurality of memory chips.

3. The memory chip according to claim 1, wherein the input buffer is configured to receive an input of an address of writing destination and an input of write data from the I/O signal line in this order, the input buffer being switchable between an active state and an inactive state.

4. The memory chip according to claim 3, wherein the address-cycle identifying unit stops outputting the detection result at a timing after the chip determining unit outputs the determination result.

5. The memory chip according to claim 4, wherein
the input buffer receives an input of a command including a write command through the I/O signal line,
the memory chip further includes a command determining unit configured to determine whether or not the received command is a write command when the input buffer receives the command, and
if the command determining unit determines that the received command is a write command, the buffer controller switches the state of the input buffer in accordance with the detection result, and if the command determining unit determines that the received command is not a write command, the buffer controller does not switch the state of the input buffer in accordance with the detection result.

6. The memory chip according to claim 5, wherein the memory chip forms a part of a multi-chip package.

7. The memory chip according to claim 4, wherein the memory chip forms a part of a multi-chip package.

8. The memory chip according to claim 3, wherein the memory chip forms a part of a multi-chip package.

9. The memory chip according to claim 2, wherein the address-cycle identifying unit stops outputting the detection result at a timing after the chip determining unit outputs the determination result.

10. The memory chip according to claim 9, wherein
the input buffer receives an input of a command including a write command through the I/O signal line,
the memory chip further includes a command determining unit configured to determine whether or not the received command is a write command, when the input buffer receives the command, and
if the command determining unit determines that the received command is a write command, the buffer controller switches the states of the input buffer in accordance with the detection result, and if the command determining unit determines that the received command is not a write command, the buffer controller does not switch the states of the input buffer in accordance with the detection result.

11. The memory chip according to claim 1, wherein the input buffer configured to receive an input of an address of writing destination and an input of write data from the I/O signal line in this order, the input buffer being switchable between an active state and an inactive state.

12. The memory chip according to claim 11, wherein the address-cycle identifying unit stops outputting the detection result at a timing after the chip determining unit outputs the determination result.

13. The memory chip according to claim 12, wherein
the input buffer receives an input of a command including a write command through the I/O signal line, the memory chip further includes a command determining unit configured to determine whether or not the received command is a write command, when the input buffer receives the command, and if the command determining unit determines that the received command is a write command, the buffer controller switches the states of the input buffer in accordance with the detection result, and if the command determining unit determines that the received command is not a write command, the buffer controller does not switch the states of the input buffer in accordance with the detection result.

14. The memory chip according to claim 1, wherein the address-cycle identifying unit stops outputting the detection result at a timing after the chip determining unit outputs the determination result.

15. The memory chip according to claim 14, wherein
the input buffer receives an input of a command including a write command through the I/O signal line,
the memory chip further includes a command determining unit configured to determine whether or not the received command is a write command, when the input buffer receives the command, and
if the command determining unit determines that the received command is a write command, the buffer controller switches the states of the input buffer in accordance with the detection result, and if the command determining unit determines that the received command is not a write command, the buffer controller does not switch the states of the input buffer in accordance with the detection result.

16. A multi-chip package comprising:
a plurality of memory chips each including a memory region and stacked one upon another; and
an I/O signal line to access the memory regions, the I/O signal line connected in common to the plurality of stacked memory chips, wherein
each of the plurality of memory chips includes:
an input buffer configured to receive an input of an address for writing destination and an input of write data from the I/O signal line in this order at the time of wiring, and the input buffer being switchable between an active state and an inactive state;
a chip determining unit configured to perform a chip determination after the input buffer receives the address of writing destination to determine whether or not the memory chip of the chip determining unit is a writing target on the basis of the received address of writing destination, and to output a determination result of the chip determination;
a buffer controller configured to switch the input buffer from one state to another in accordance with the determination result outputted by the chip determining unit; and
an address-cycle identifying unit configured to detect a final cycle of the address of writing destination, and to output a detection result at a timing before the chip determining unit outputs the determination result, wherein
the buffer controller keeps the input buffer in the active state irrespective of the determination result of the chip determination while the address-cycle identifying unit is outputting the detection result.

* * * * *